United States Patent [19]

Ansell et al.

[11] 3,920,485

[45] Nov. 18, 1975

[54] THIN INSULATING FILM CONTAINING METALLIC PARTICLES

[75] Inventors: George S. Ansell, Loudonville; Gary Judd, Albany; Carl A. Grove, Schenectady, all of N.Y.

[73] Assignee: The United States of America as represented by the Secretary of the Navy, Washington, D.C.

[22] Filed: May 21, 1973

[21] Appl. No.: 362,143

[52] U.S. Cl. ................ 148/6.3; 75/.5 BC; 252/512; 427/35

[51] Int. Cl.[2] ........................ B44D 1/18; B22F 1/18

[58] Field of Search ...... B05C/1/18; 117/212, 37 R, 117/93.3; 75/.5 BC; 252/512, 518

[56] References Cited

UNITED STATES PATENTS

| | | | |
|---|---|---|---|
| 3,032,427 | 5/1962 | Klingler et al. | 252/512 |
| 3,360,398 | 12/1967 | Gariboth | 117/212 |
| 3,472,688 | 10/1969 | Hayashi et al. | 117/212 |
| 3,557,440 | 1/1971 | Haberecht | 117/212 |
| 3,567,607 | 3/1971 | Saunders et al. | 252/512 |
| 3,615,953 | 10/1971 | Hill | 117/212 |
| 3,801,366 | 4/1974 | Lamelson | 117/212 |

*Primary Examiner*—John D. Welsh
*Attorney, Agent, or Firm*—R. S. Sciascia; L. I. Shrago

[57] ABSTRACT

An oxide layer formed on a metallic surface has platelets of the metallic substance disposed therein at selected sites or in selected patterns depending upon the use of the composition in the fabrication of solid state electronic devices.

1 Claim, 3 Drawing Figures

THIN INSULATING FILM CONTAINING METALLIC PARTICLES

The present invention relates generally to thin film compositions and, more particularly, to a thin insulating film containing a controlled distribution of conducting particles therein which may be used in the fabrication of solid state electronic components.

Thin film techology is presently being utilized to fabricate a variety of electronic devices such as, for example, resistors, capacitors, interconnected RC networks and transistors. The advantages of the thin film process in, for example, the formation of barrier layer diodes is the desirable high rectification ratios obtainable.

It is, accordingly, a primary object of the present invention to provide a composition of matter which consists of a thin insulating film having a distribution of conducting metallic particles therein for use in the fabrication of electronic devices.

It is another object of the present invention to provide an insulator-conductor thin film composition which can be utilized in the fabrication of solid state electronic components.

A still further object of the present invention is to provide a method of fabricating a thin insulating film which has metallic particles distributed therein in accordance with a pre-selected pattern.

Other objects, advantages and novel features of the invention will become apparent from the following detailed description of the invention when considered in conjunction with the accompanying drawing wherein.

Figure 1:
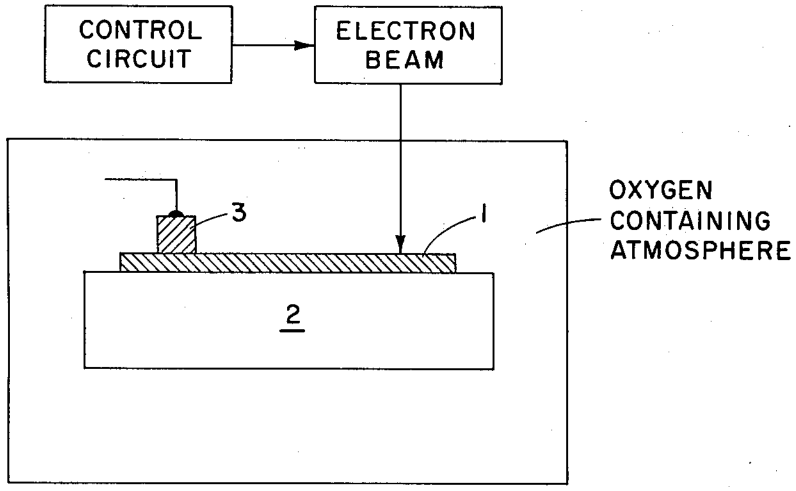
FIG. 1 illustrates the preliminary step in preparing a barrier-layer diode utilizing the composition of the present invention.

According to the present invention, a thin foil of aluminum, for example, is oxidized in the presence of an electron beam and thin platelets of aluminum nucleate and grow in a matrix of forming amorphous aluminum oxide. The aluminum platelets are randomly distributed throughout the amorphous oxide matrix but are orientated such that they are parallel to the foil surface.

One procedure which may be utilized to produce an insulating film according to the present invention with the conducting metallic particles distributed therein from aluminum or aluminum alloys involves the following steps:

An aluminum sheet 10 to 12 mils thick is electropolished in a 20 percent by volume solution of percloric acid in absolute ethanol at room temperature until a thin film is obtained. In this regard, a thickness less than 200A is desirable. Thereafter, the aluminum thin foil is heated in a vacuum $5 \times 10^{-6}$ to $1 \times 10^{-3}$ torr at a temperature below 450°C. The next step involves directing an electron beam of 50 to 100 KV at 10 to 60 milliamps through the thin foil at selected locations while it is oxidizing. The atmosphere containing the specimen and the electron beam should be as free of hydrocarbons as possible in order to cut down on surface contamination. Finally, the foil is cooled to room temperature.

The structure resulting from this process is a matrix of amorphous aluminum oxide having a distribution of metallic aluminum platelets therein together with the remnant of the original aluminum which has not oxidized. The orientation of these platelets will be perpendicular to the electron beam.

The process variables are the initial aluminum foil thickness, temperature, pressure, electron beam intensity, cleanliness of electron beam and accelerating voltage.

It will be appreciated that normal oxidation of the aluminum without the interaction of the electron beam occurs by the reaction first of oxygen with the aluminum forming a thin oxide. Continued oxide growth is accomplished by the diffusion of aluminum ions through the oxide until these ions reach the oxide-to-atmosphere surface at which point the aluminum ions then react with oxygen in the atmosphere to form additional oxide. Continued growth of the oxide layer continues by this process of aluminum diffusion through the oxide until the aluminum ions react with the oxygen in the environment to form the aluminum oxide.

When this oxidation process occurs at the same time the aluminum oxide is being subjected to a high energy electron beam, some of the aluminum ions diffusing through the oxide layer become deionized by the capture of an electron. Aluminum neutral atoms are, consequently, formed within the oxide layer. Additional capture of electrons by these atoms acts to charge the aluminum atoms within the non-conducting oxide. As a result of the Coulomb interaction between these charged metal atoms with the oppositely charged diffusing aluminum ions, diffusing ions tend to migrate to aluminum atoms within the oxide. The resulting meeting causes these ions to become deionized and, thus, there is a further contribution to the growth of the aluminum platelets within the oxide layer. As the platelets grow, their cross section for electron capture increases and the effects of continued platelet charging with the attendent Coulombic interaction to additional diffusing aluminum ions results in the growth within the oxide of the aluminum platelets.

It should be appreciated that the method above described is only representative of the procedures which may be utilized to form the compositions of the present invention. Thus, for example, the desired metallic thickness could be obtained by vapor deposit. This thickness, also, is a matter of choice depending primarily upon the structure being fabricated. In the same connection, the beam voltage range may be wider than that mentioned, extending from 1 KV to 500 KV. Instead of aluminum, the process may be carried out with a tantalum sheet or foil thickness which develops a tantalum oxide formation. The overall technique generally has application to any system where the metal oxidizes by the diffusion of the metal ion through the oxide to react on the oxide surface with oxygen in an analgous manner as for the aluminum oxide growth previously described.

It would also be pointed out that by selectively controlling the movement of the electron beam and its presence at any particular location, one may control the platelet growth and localize it at a given site. In this manner, a single conducting pattern or a pattern of such paths may be established through the oxide layer, extending from the aluminum sheet to the exposed boundary surface of this layer. These paths may serve as interconnecting links for connecting selected overlaying deposited regions to a conducting plate while having other adjacent regions insulated therefrom.

Referring now to the drawings which show the sequential operations involved in fabricating a diode having the composition of the present invention as its barrier layer, it will be seen from FIG. 1 the first step involves mounting or otherwise positioning a strip of aluminum foil 1 on a suitable support 2. A first electrical terminal 3 is next attached to the foil surface at a location adjacent one end thereof. The manner in which this contact is formed and its location is not critical as far as the present invention is concerned, and any suitable deposition process may be utilized provided it does not contaminate the foil surface.

The structure above described is next placed in an oxygen containing atmosphere, and this atmosphere preferably should be maintained under the temperature and pressure conditions previously described so as to insure the formation of an appropriate oxide layer. While in the atmosphere, pre-selected areas of the foil surface as it is being oxidized are exposed to an internal electron beam source having the characteristics previously mentioned. Instead of an electron beam wholly contained in this atmosphere, an external beam having the necessary deflection controlled circuits may be employed providing the enclosure for the atmosphere is made of a material which is transparent to such a beam. Likewise, a plurality of electron beams may be directed at the foil surface and deflected to strike a plurality of areas simultaneously.

Figure 2:
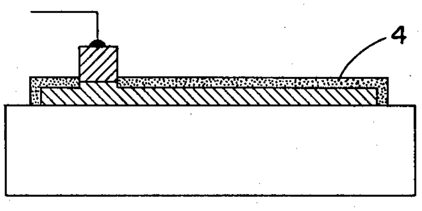
FIGS. 2 and 3 illustrate additional steps of the processing operation.

Oxidizing the aluminum foil in the presence of the electron beam produces the structure shown in FIG. 2 wherein the oxide layer 4 contains aluminum platelets in those regions which have been irradiated by the electron beam. For purposes of forming a diode, only the surface to the right of the electric contact need be exposed to the electron beam.

After the thin insulating film is formed, a suitable electrical conducting material 5, such as vapor deposited gold, is applied over the region which has been treated by the electron beam to contain the conducting platelets. Suitable masking may be affixed to those areas and locations where this over-lay material is not to be applied. As a last step, the second electric contact 6 is formed over the gold conducting surface at a location adjacent one end thereof.

Figure 3:
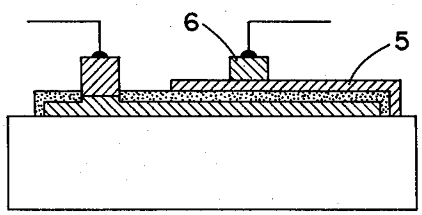

As shown in FIG. 3, the electrical component produced comprises, in electrical series, a first electrical contact 3, a region of aluminum 1, a region of aluminum oxide containing aluminum platelets 4, a region of conducting material 5 — gold in this case and, finally, a second electrical contact 6.

Although aluminum oxide is a good insulator, electron tunneling occurs over small distances. By adjusting the electron beam intensity and accelerating voltage together with the oxidation space, the size and spacing of the aluminum platelets in the oxide layer can be controlled. Consequent of this will be an alteration of the tunneling distance. On this basis, the oxide layer becomes conductive only when the applied voltage is sufficient for tunneling to be probable. This tunneling voltage may be controlled, therefore, either by varying the original fabrication conditions or by external biasing.

The current versus voltage characteristic of the diode fabricated according to the present invention exhibits similar forward and reverse current conditions. The absolute separation or gap between the voltages, corresponding to the starting currents, may be modified, as noted, by selectively changing the density distribution of the platelets in the oxide layer.

The total characteristic may be shifted along the voltage axis in either direction by an application of an external bias potential. Thus, for example, substantial backward current may be permitted to flow at very low backward voltages while substantially no forward current is allowed at similar forward voltage levels. Consequently, rectification may be achieved, for example, at smaller signal voltages than with convention rectifiers.

Additionally, the gap which defines the voltage spread between the starting forward and reverse currents may be biased so that the diode exhibits the electrical characteristics of a semi-conductor.

What is claimed is:

1. A method for fabricating a thin film electronic circuit component which comprises the steps of exposing a surface area of a metallic element to an atmosphere containing oxygen so as to cause an insulating oxide layer to start forming thereon and while said layer is being formed, directing a high energy electron beam into selected locations within said area so that ions of the metallic substance, which are diffusing through said oxide layer at said locations as said layer is being formed, become deionized by the capture of an electron, the neutral atoms of the metallic substance thus formed subsequently capturing electrons, becoming charged oppositely from the diffusing metallic ions which migrate thereto, become deionized and contribute to the growth of platelets within said oxide layer whereby a thin insulating film containing conducting platelets is produced.

* * * * *